THERMOELECTRIC COMPOSITIONS AND DEVICES UTILIZING THEM

Filed Dec. 7, 1960 2 Sheets-Sheet 1

SEEBECK THERMOCOUPLE DEVICE

VARIATION OF RESISTIVITY WITH TEMPERATURE FOR $AgSbTe_2$ - GeTe ALLOYS

INVENTOR.
Eric F. Hockings
BY
W. S. Hill
AGENT

VARIATION OF THERMOELECTRTIC POWER Q WITH TEMPERATURE T FOR P-TYPE $AgSbTe_2$ - GeTe ALLOYS

VARIATION OF FIGURE OF MERIT Z WITH WITH TEMPERATURE FOR $AgSbTe_2$-GeTe ALLOYS

INVENTOR.
Eric F. Hockings
BY
W. B. Hill
AGENT

United States Patent Office 3,061,657
Patented Oct. 30, 1962

3,061,657
THERMOELECTRIC COMPOSITIONS AND DEVICES UTILIZING THEM

Eric F. Hockings, Princeton, N.J., assignor to Radio Corporation of America, a corporation of Delaware
Filed Dec. 7, 1960, Ser. No. 74,337
16 Claims. (Cl. 136—5)

This invention relates to improved thermoelectric compositions, and improved thermoelectric devices made of these compositions.

When two rods or wires of dissimilar thermoelectric compositions have their ends joined to form a continuous loop, two thermoelectric junctions are established between the respective ends so joined, and the pair or couple of dissimilar materials is known as a thermocouple. If the two junctions are maintained at different temperatures, an electromotive force will be set up in the circuit thus formed. This effect is called the thermoelectric or Seebeck effect, and may be regarded as due to the charge carrier concentration gradient produced by the temperature gradient in the two materials. The effect cannot be ascribed to either material alone, since two dissimilar (thermoelectrically complementary) materials are necessary to obtain the effect. It is therefore customary to measure the Seebeck effect produced by a particular material by forming a thermocouple in which this material is one circuit member, and copper or lead is the other circuit member. The thermoelectric power of a material is the open circuit voltage developed by the thermocouple when the two junctions are maintained at a temperature difference of 1° C.

The Seebeck effect is utilized in many practical applications, such as the thermocouple thermometer. Recently the Seebeck effect has become important for the conversion of heat energy directly into electrical energy.

A related phenomenon known as the Peltier effect has been utilized in environmental cooling and refrigeration. This phenomenon is observed as the generation of heat at one junction and the absorption of heat at the other junction when an electric current is passed through the thermoelectric circuit described above. The Peltier effect may be regarded as due to the difference in potential energy of charge carriers in the two materials. As both charge and energy must be conserved when charge carriers move across a thermoelectric junction, the charge carriers must interchange energy with their surroundings at the junction. The Peltier effect also is not ascribed to either material alone, but rather is regarded as the result of the interaction between two dissimilar (thermoelectrically complementary) materials.

Since at the microscopic level these effects are based on the same fundamental parameters of temperature gradient and charge carrier distribution, the Seebeck and Peltier effects are not independent. For a given material, the numerical measures of these effects, known as the Seebeck coefficient and the Peltier coefficient respectively, are interrelated by an equation due to Kelvin, which states $$H_0=\pi I=-QIT$$

where $H_0$ is the heat liberated in unit time at the junction when current I passes through it, $\pi$ is the Peltier coefficient of the junction, T is the absolute temperature of the junction, and Q is the Seebeck coefficient or thermoelectric power of the junction.

An object of this invention is to provide improved thermoelectric compositions having improved thermoelectric properties for application to power generation and environmental cooling.

Another object is to provide improved thermoelectric compositions and alloys which may be readily and easily prepared and have high figures of merit.

Still another object of this invention is to provide improved thermoelectric devices capable of efficient operation for the direct conversion of heat into electrical energy.

These and other objects of the invention are accomplished by providing improved thermoelectric compositions having thermoelectric properties significantly better than those of previously known materials. The compositions consist essentially of 95 to 70 mol percent of at least one material selected from the group consisting of germanium selenide and germanium telluride, and 5 to 30 mol percent $ABX_2$, in which A is at least one element selected from the group consisting of copper, silver and gold, B is at least one element selected from the group consisting of arsenic, antimony and bismuth, and X is at least one element selected from the group consisting of sulfur, selenium and tellurium. According to a preferred embodiment of the invention, the material $ABX_2$ corresponds to $AgSbTe_2$. According to another embodiment of the invention, a portion of the tellurium in this compound is replaced by selenium, so that the formula of this material corresponds to $AgSbSe_aTe_b$, wherein $a$ and $b$ are positive numbers whose sum is 2. Similarly, a portion of the silver may be replaced by an equivalent amount of copper or gold or both, and a portion of the antimony may be replaced by an equivalent amount of arsenic or bismuth or both. The compositions according to the invention are mostly P-type as made, but some are N-type. The compositions of the invention do not require the addition of acceptor or donor additives.

The invention will be described in greater detail by reference to the accompanying drawing, in which.

Figure 1:
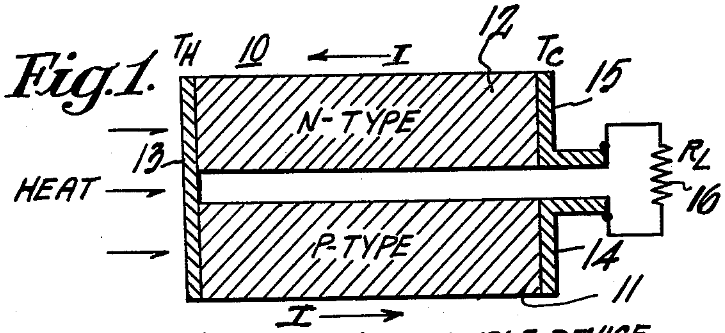
FIGURE 1 is a schematic, cross-sectional, elevational view of a thermoelectric device according to the invention for the direct conversion of heat energy into electrical energy by means of the Seebeck effect.

Since good thermoelectric materials are near-degenerate semiconductors, they may be classed as N-type or P-type, depending on whether the majority carriers are electrons or holes, respectively. The conductivity type of thermoelectric materials may in general be controlled by including appropriate additives which consist of acceptor or donor impurity substances. Whether a particular material is N-type or P-type may be determined by noting the direction of current flow across a junction formed by a circuit member or thermoelement of the particular thermoelectric material and another thermal element of complementary material when operated as a thermoelectric generator according to the Seebeck effect. The direction of the positive (conventional) current in the external circuit connecting the cold ends of the two circuit members will be from the P-type circuit member toward the N-type circuit member. When the thermoelectric material which is in question and another element of complementary material form a cold junction according to the Peltier effect, the electromotive force is impressed to cause the current directions to be opposite those just described.

There are three fundamental requirements for desirable thermoelectric materials. The first requirement is the development of a high electromotive force per degree difference in temperature between junctions in a circuit containing two thermoelectric junctions. This property is referred to as the thermoelectric power of the material [Q], and may be defined as $$\frac{d\theta}{dT}$$

where $d\theta$ is the potential difference induced by a temperature difference $dT$ between two junctions of an element made of the material. The thermoelectric power of a material may also be considered as the energy relative to the Fermi level transmitted by a charge carrier along the material per degree temperature difference. The second requirement is a low thermal conductivity [K], since it would be difficult to maintain either high or low temperatures at a junction of a thermoelement if the material conducted heat too readily. The third requisite for a good thermoelectric material is high electrical conductivity [$\sigma$], or, conversely stated, low electrical resistivity [$p$]. This requisite is apparent since the temperature difference between two junctions will not be great if the current passing through the circuit generates excessive Joulean heat.

A quantitative approximation of the quality of a thermoelectric material may be made by relating the above three factors in a Figure of Merit Z, which is usually defined as $$Z=\frac{Q^2}{pK}$$

where Q is the thermoelectric power, $p$ is the electrical resistivity, and K is the thermal conductivity. The validity of this figure of merit as the indication of usefulness of materials in practical applications is well established. For a more detailed discussion of this figure of merit, see chapter 8, "Evaluation and Properties of Materials for Thermoelectric Applications," by F. D. Rosi and E. G. Ramberg, in "Thermoelectricity," edited by P. H. Egli, John Wiley and Sons, New York, 1960. Thus, as an objective, high thermoelectric power, low electrical resistivity and low thermal conductivity are desired. These objectives are difficult to attain because materials which are good conductors of electricity are usually good conductors of heat, and the thermoelectric power and electrical resistivity of a material are not independent of each other. Hence this objective becomes the provision of a material with maximum ratio of electrical to thermal conductivities and a high thermoelectric power.

The thermal conductivity K may be considered as the sum of one component due to lattice heat conduction and another component due to heat conduction by charge carriers (electrons). In metals, the thermal conductivity component due to electron conduction is larger than the component due to phonons, which are quanta of energy associated with atomic lattice vibrations. In non-degenerate semiconductors the thermal conductivity component due to lattice phonons is comparable to or larger than the component due to thermal conductivity by charge carriers. It is believed that the thermal conductivity component due to heat conduction by charge carriers cannot be reduced. However, it is possible to reduce the total heat conductivity [K] by substitutionally alloying into the semiconductor lattice another component which crystallizes in a similar lattice and has approximately the same lattice constant. It is theorized that the substitutional alloying introduces strains into the crystal lattice, which lower the mean free path of phonons without, at the same time, scattering, electrons which have longer wavelengths than the phonons. Hence, the lattice thermal conductivity [$K_{ph}$] is decreased by such substitutional alloying, without changing the thermoelectric power for a given resistivity in extrinsic material where impurity scattering is predominant.

A thermoelectric device, according to the invention, for the efficient conversion of thermal energy directly into electrical energy is illustrated in FIGURE 1. The device 10 comprises two different circuit members of thermoelements 11 and 12 which are conductively joined at one end, hereinafter denoted the hot junction $T_H$, by means of an intermediate member 13. The intermediate member 13 may be in the form of a buss bar or a plate, and is made of a material which is thermally and electrically conductive, and has negligible thermoelectric power. Metals and alloys are suitable materials for this purpose. In this example, intermediate member 13 consists of a copper plate. The circuit members or thermoelements 11 and 12 terminate at the end opposite the thermoelectric junction in electrical contacts 14 and 15 respectively. In this example, contacts 14 and 15 are copper plates.

As indicated above, it has been found that improved efficiency is obtained in devices of this type by preparing at least one of the two circuit members 11 and 12 from a thermoelectric composition consisting essentially of 95 to 70 mol percent of at least one material selected from the group consisting of germanium selenide and germanium telluride and 5 to 30 mol percent of $ABX_2$, in which A is at least one element selected from the group consisting of copper, silver and gold, B is at least one element selected from the group consisting of arsenic, antimony and bismuth, and X is at least one element selected from the group consisting of sulfur, selenium and tellurium.

*Example I*

In this example, circuit member 11 is made of a P-type thermoelectric material having a composition within the above range. The specific preferred composition of this example consists of 90 mol percent germanium telluride and 10 mol percent silver antimony telluride.

The compositions according to this embodiment of the invention are naturally P-type, and do not require the addition of acceptor additives. The other circuit member 12 is made of thermoelectrically complementary material, which in this case consists of N-type thermoelectric material. Examples of suitable N-type materials for this purpose are bismuth telluride alloyed with up to 1.64 weight percent of one or more of the sulfides or selenides of copper or silver, as described in U.S. Patent 2,902,529, issued to C. J. Busanovich on September 1, 1959, and assigned to the same assignee as that of the instant application. Other suitable N-type thermoelectric alloys consist of bismuth telluride and 5 to 40 mol percent bismuth selenide alloyed with from 0.13 weight percent to 0.34 weight percent copper sulfide or silver sulfide, based on the total weight of bismuth telluride and bismuth selenide, as described in U.S. Patent 2,902,528, issued to F. D. Rosi on September 1, 1959, and assigned to the same assignee as that of the instant application. Still other suitable N-type thermoelectric alloys consist of bismuth telluride with 5 to 70 mol percent antimony telluride and doped with .01 to 1.0 weight percent of a halide of bismuth or antimony, as described in U.S. Patent 2,957,937, issued to R. V. Jensen and F. D. Rosi on October 25, 1960, and assigned to the same assignee as that of the instant application.

In the operation of the device 10, the metal plate 13 is heated to a temperature $T_H$ and becomes the hot junction of the device. The metal contacts 14 and 15 on each thermoelement are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15, respectively. The electromotive force developed under these conditions produces in the external circuit a flow of (conventional) current [I] in the direction shown by arrows in FIG. 1, that is, in the external circuit the current flows from the P-type thermoelement 11 toward the N-type thermoelement 12.

The device is utilized by connecting a load [$R_L$], shown as a resistance 16 in the drawing, between the contacts 14 and 15 of thermoelements 11 and 12, respectively.

A series of compositions according to the invention are easily prepared by melting together the proper ratios of germanium telluride and silver antimony telluride. The materials may be melted together in a sealed evacuated Vycor tube, or in a fused quartz ampule. Alternatively, the correct proportions of elemental silver, germanium, antimony and tellurium may be utilized. For example, the powdered or granulated ingredients may thus be heated together to a temperature of about 1000° C. The ingredients are allowed to react at this temperature for about one hour in a furnace which is slowly rocked to obtain uniform mixing of the melt. The melt is permitted to cool slowly in the furnace by a Bridgman temperature-gradient technique. The resulting ingot may be zone-levelled by passing a molten zone along the ingot first in one direction, and then in the opposite direction. The tube or ampule is next removed and then opened to obtain the solidified ingot.

The composition of this example may be prepared as described above by melting together in an ampule 16.9 grams granulated silver, 103 grams granulated germanium, 19.1 grams granulated antimony, and 221 grams granulated tellurium. This preferred composition corresponds to the formula $AgSbGe_9Te_{11}$. The thermoelectric power [Q] of this composition is about +160 microvolts per degree centigrade when measured at 400° C. The electrical resistivity [$p$] is about $9\times10^{-4}$ ohm-cm. at 400° C.; and the total thermal conductivity [K] is about .0234 watt per centimeter per degree centigrade when measured at 25° C. The Figure of Merit Z for this composition, that is, the value of $$\frac{Q^2}{pK}$$

is estimated to be about $1.5\times10^{-3}$ deg.$^{-1}$ at 400° C. This value of Z is dependent on the value of K at 400° C., which value is difficult to measure accurately. For a more detailed discussion of these factors, see the paper by F. D. Rosi, J. P. Dismukes and E. F. Hockings, "Semiconductor Materials for Thermoelectric Power Generation up to 700° C.," in Electrical Engineering, June, 1960.

Figure 2:
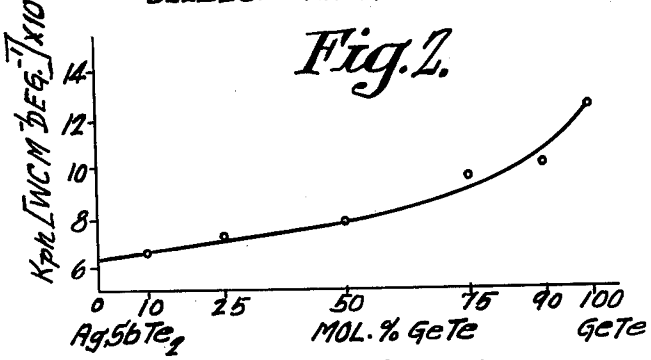
FIGURE 2 is a graph showing the variation of the lattice thermal conductivity with composition in one series of thermoelectric alloys according to the invention.
Figure 3:
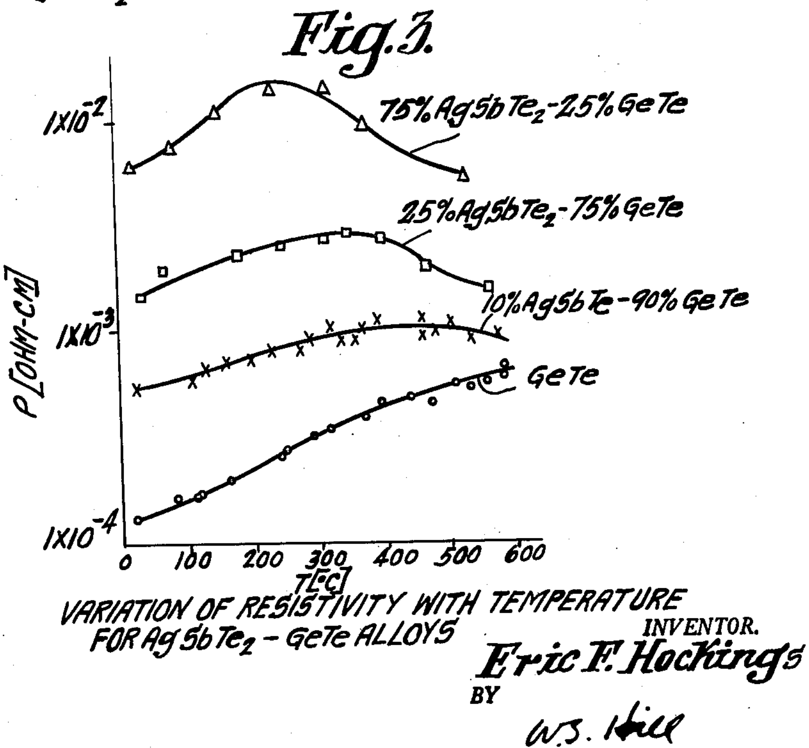
FIGURE 3 is a graph showing the variation of resistivity with temperature for some P-type thermoelectric alloys according to the invention.
Figure 4:
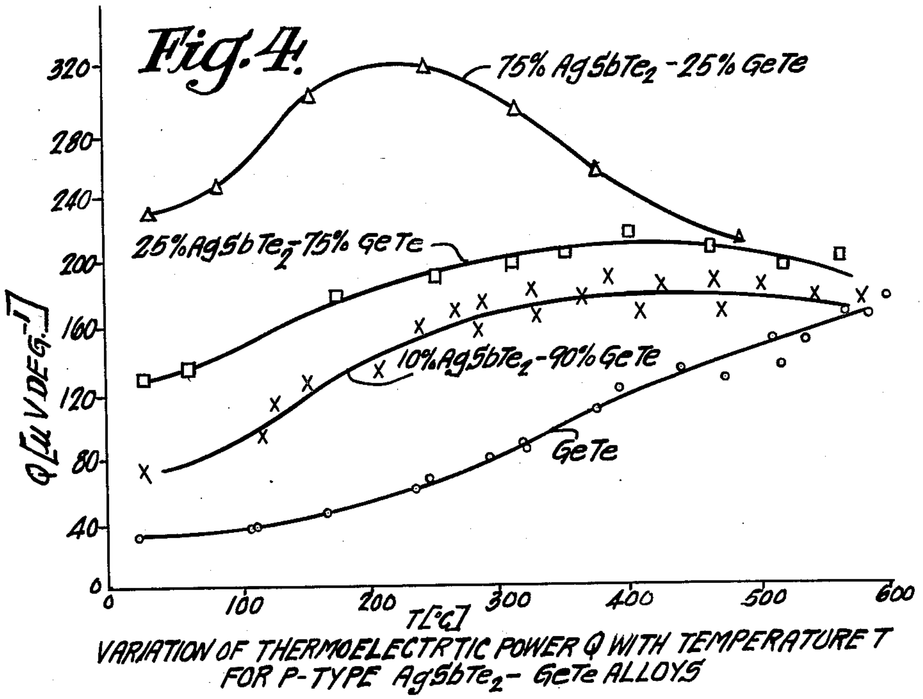
FIGURE 4 is a graph showing the variation of thermoelectric power with temperature for the P-type alloys of FIGURE 3.
Figure 5:
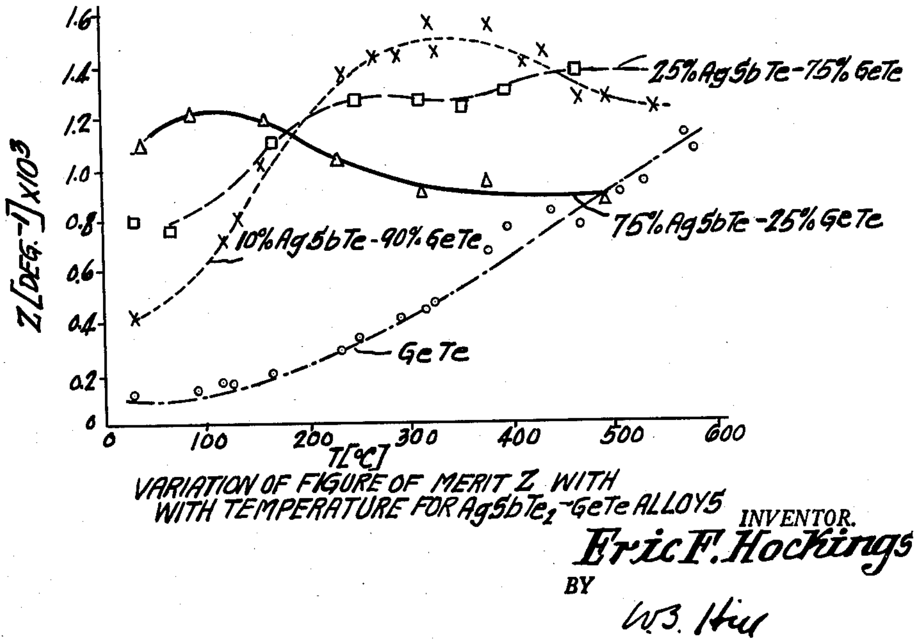
FIGURE 5 is a graph showing the variation of the Figure of Merit Z with temperature for the thermoelectric materials of FIGURE 3.

The variation of lattice thermal conductivity $K_{ph}$ at room temperature with composition for the alloys of germanium telluride and silver antimony telluride is plotted in FIG. 2. The value for $K_{ph}$ for the composition of this example is about .0098 watt per cm. per degree centigrade. The value of $K_{ph}$ for these compositions increases monotonically with increasing GeTe content. The variation of resistivity with temperature for three $AgSbTe_2$—GeTe alloys is plotted in FIG. 3, along with pure GeTe for comparison. The variation of thermoelectric power [Q] with temperature for the alloys of FIG. 3 is plotted in FIG. 4, while FIG. 5 shows the variation of Z with temperature for the same materials.

*Example II*

In this example, one circuit member of a thermoelectric device which utilizes the Seebeck effect for directly converting thermal energy into electrical energy is prepared from a material consisting of 50 mol percent germanium telluride and 50 mol percent copper bismuth selenide. The composition of this example is of N-type conductivity as made, and does not require the addition of any donor impurities.

The composition of this example may be prepared from the ingredients as described above by melting together 1.340 grams copper, 4.425 grams bismuth, 3.334 grams selenium, 1.532 grams germanium, and 2.692 grams tellurium. The composition of Example II was found to exhibit a thermoelectric power [Q] of −50 microvolts per degree centigrade when measured at 25° C. and a resistivity [$p$] of $7.1\times10^{-3}$ ohm-cm. at 25° C. This composition can be utilized for the N-type thermoelement 12 in the Seebeck device of FIG. 1. Thus compositions of both conductivity types can be prepared in accordance with this invention.

*Example III*

In this example, at least one of the two circuit members 11 and 12 of a thermoelectric device 10 which utilizes the Seebeck effect for directly converting thermal energy into electrical energy is prepared from a material composed of 50 mol percent germanium selenide and 50 mol percent silver antimony telluride. This composition is of P-type conductivity as made, and does not require the addition of any acceptor additives. In this embodiment, thermoelement 11 of thermoelectric device 10 is made of the P-type composition described above, while the thermoelement 12 is made of one of the N-type thermoelectric materials previously mentioned, or may be of the material described in Example II above.

The composition of this Example III may be prepared from the granulated ingredients as described above by melting together 5.69 grams silver, 6.44 grams antimony, 13.5 grams tellurium, 3.84 grams germanium, and 4.17 grams selenium. The composition of Example III was found to exhibit a thermoelectric power [Q] of +290 microvolts per degree centigrade when measured at 25° C.; a resistivity [$p$] of $2.1\times10^{-2}$ ohm-cm. at 25° C.; and a total thermal conductivity [K] of .0048 watt per centimeter per degree centigrade at 25° C.

It is theorized that proper substitutional alloying increases the energy gap of thermoelectric materials. A large energy gap is desirable for thermoelectric materials, since it permits operation of thermocouples made of such materials at high hot-junction temperatures without a prohibitive loss in thermoelectric properties. It is believed that an increase in the energy gap of a semiconductor shifts the onset of intrinsic conduction due to thermal generation of electron-hole pairs to high temperatures. The generation of electron-hole pairs in thermoelectric circuit members must be minimized, since it results not only in a marked decrease in the thermoelectric power [Q], but also in an increase in thermal conductivity [$p$] due to the diffusion of the electron-hole pairs from the hot junction to the cold junction. However, it will be understood that the practice of the instant invention is not dependent on the particular theoretical explanation of the results obtained.

There have thus been described improved thermoelectric materials of novel composition which possess advantageous thermoelectric properties and which are easily prepared. Thermoelements and thermoelectric devices made from these materials are useful in various applications, such as the direct conversion of heat into electricity.

What is claimed is:

1. A thermoelectric composition consisting essentially of 95 to 70 mol percent of at least one material from the group consisting of germanium selenide and germanium telluride and 5 to 30 mol percent of $ABX_2$, in which A is at least one element selected from the group consisting of copper, silver and gold, B is at least one element selected from the group consisting of arsenic, antimony and bismuth, and X is at least one element selected from the group consisting of sulfur, selenium and tellurium.

2. A thermoelectric composition consisting essentially of 95 to 70 mol percent germanium telluride and 5 to 30 mol percent of $ABX_2$, in which A is at least one element selected from the group consisting of copper, silver and gold, B is at least one element selected from the group consisting of arsenic, antimony and bismuth, and X is at least one element selected from the group consisting of sulfur, selenium and tellurium.

3. A thermoelectric composition consisting essentially of 95 to 70 mol percent of at least one element selected from the group consisting of germanium selenide and germanium telluride, and 5 to 30 mol percent of $AgSbSe_aTe_b$, wherein $a$ and $b$ are positive numbers whose sum is 2.

4. A thermoelectric composition consisting essentially of 95 to 70 mol percent germanium telluride, and 5 to 30 mol percent of $AgSbSe_aTe_b$, wherein $a$ and $b$ are positive numbers whose sum is 2.

5. A thermoelectric composition consisting essentially of 95 to 70 mol percent germanium telluride and 5 to 30 mol percent $AbSbTe_2$.

6. A thermoelectric composition consisting essentially of 95 to 70 mol percent germanium selenide and 5 to 30 mol percent $AgSbTe_2$.

7. A thermoelectric composition consisting essentially of 10 mol percent $AgSbTe_2$ and 90 mol percent germanium telluride.

8. A thermoelectric composition consisting essentially of 10 mol percent $AgSbTe_2$ and 90 mol percent germanium selenide.

9. A thermoelectric device comprising two circuit members of thermoelectrically complementary materials, said members being conductively joined to form a thermoelectric junction, at least one of said two members consisting essentially of an alloy of 95 to 70 mol percent of at least one material selected from the group consisting of germanium selenide and germanium telluride and 5 to 30 mol percent of $ABX_2$ in which A is at least one element selected from the group consisting of copper, silver and gold, B is at least one element selected from the group consisting of arsenic, antimony and bismuth, and X is at least one element selected from the group consisting of sulfur, selenium and tellurium.

10. A thermoelectric device comprising two circuit members of thermoelectrically complementary materials, said members being conductively joined to form a thermoelectric junction, at least one of said two members consisting essentially of an alloy of 95 to 70 mol percent germanium telluride and 5 to 30 mol percent of $ABX_2$ in which A is at least one element selected from the group consisting of copper, silver and gold, B is at least one element selected from the group consisting of arsenic, antimony and bismuth, and X is at least one element selected from the group consisting of sulfur, selenium and tellurium.

11. A thermoelectric device comprising two circuit members of thermoelectrically complementary materials, said members being conductively joined to form a thermoelectric junction, at least one of said two members consisting essentially of an alloy of 95 to 70 mol percent of at least one material selected from the group consisting of germanium selenide and germanium telluride and 5 to 30 mol percent of $AgSbSe_aTe_b$, wherein $a$ and $b$ are positive numbers whose sum is 2.

12. A thermoelectric device comprising two circuit members of thermoelectrically complementary materials, said members being conductively joined to form a thermoelectric junction, at least one of said two members consisting essentially of an alloy of 95 to 70 mol percent germanium telluride and 5 to 30 mol percent of $AgSbSe_aTe_b$, wherein $a$ and $b$ are positive numbers whose sum is 2.

13. A thermoelectric device comprising two circuit members of thermoelectrically complementary materials, said members being conductively joined to form a thermoelectric junction, at least one of said two members consisting essentially of 95 to 70 mol percent germanium telluride and 5 to 30 mol percent silver antimony telluride.

14. A thermoelectric device comprising two circuit members of thermoelectrically complementary materials, said members being conductively joined to form a thermoelectric junction, at least one of said two members consisting essentially of 95 to 70 mol percent germanium selenide and 5 to 30 percent silver antimony telluride.

15. A thermoelectric device comprising two circuit members of thermoelectrically complementary materials, said members being conductively joined to form a thermoelectric junction, at least one of said two members consisting essentially of an alloy of 90 mol percent germanium telluride and 10 mol percent silver antimony telluride.

16. A thermoelectric device comprising two circuit members of thermoelectrically complementary materials, said members being conductively joined to form a thermoelectric junction, at least one of said two members consisting essentially of an alloy of 90 mol percent germanium selenide and 10 mol percent silver antimony telluride.

References Cited in the file of this patent

UNITED STATES PATENTS 2,995,613 Wernick ---------------- Aug. 8, 1961

OTHER REFERENCES

Mariguchi et al.: Journal Phys. Soc., Japan, volume 12, 1957, page 100.

Thermoelectric Materials for Power Conversion, ASTIA, Ad241247, report date Aug. 10, 1959, pages 1–5.